United States Patent [19]
Lee

[11] Patent Number: 6,140,207
[45] Date of Patent: Oct. 31, 2000

[54] METHOD OF ISOLATING SEMICONDUCTOR DEVICES

[75] Inventor: Seung-Ho Lee, Chungcheongbuk-do, Rep. of Korea

[73] Assignee: LG Semicon Co., Ltd., Chungcheongbuk-Do, Rep. of Korea

[21] Appl. No.: 09/146,750

[22] Filed: Sep. 4, 1998

[30] Foreign Application Priority Data

Mar. 6, 1998 [KR] Rep. of Korea .................. 98-7422

[51] Int. Cl.$^7$ .................................................. H01L 21/76
[52] U.S. Cl. ..................... 438/427; 438/221; 438/200; 437/228; 437/67
[58] Field of Search ................... 438/427, 221, 438/200; 437/228, 67

[56] References Cited

U.S. PATENT DOCUMENTS

| | | | |
|---|---|---|---|
| 4,885,261 | 12/1989 | Yoshikawa | 437/228 |
| 5,217,919 | 6/1993 | Gaul et al. | 437/67 |
| 5,448,102 | 9/1995 | Gaul et al. | 257/510 |
| 5,966,598 | 10/1999 | Yamazaki | 438/221 |

*Primary Examiner*—Richard Elms
*Assistant Examiner*—Pho Luu
*Attorney, Agent, or Firm*—Morgan, Lewis & Bockius LLP

[57] ABSTRACT

The present invention relates to a method of isolating semiconductor devices enabling to prevent an active area from being reduced due to the increase of an isolation area by means of forming trenches, and includes the steps of forming a mask on a semiconductor substrate wherein the mask discloses field areas, forming a first and second trench in the field areas of the semiconductor substrate wherein the first trench has a larger size and a lower aspect ratio than those of the second trench and wherein the second trench has a smaller size and a higher aspect ratio than those of the first trench, depositing filling oxide on the mask and in the first and second trench by a method including characteristic of sputtering wherein the first and second trench are filled up with the filling oxide and a void is formed on a lower part of the second trench, and forming field oxide film by means of etching back the filling oxide to remain inside the first and second trench.

19 Claims, 4 Drawing Sheets

METHOD OF ISOLATING SEMICONDUCTOR DEVICES

This application claims the benefit of Korean Patent Application No. 98-7422, filed Mar. 6, 1998, which is hereby incorporated by reference.

BACKGROUND OF THE INVENTION

1. Field of the Invention

The present invention relates to a method of isolating semiconductor devices enabling to prevent an active area from being reduced due to the increase of an isolation area by means of forming trenches.

2. Discussion of the Related Art

As the integration of semiconductor device has been developed, so the technology for reducing isolation areas occupying great portions in semiconductor device has been pursued for actively.

In general, semiconductor devices have been isolated from one another by LOCOS that is Local Oxidation of Silicon. LOCOS is the process as following. A pad oxide film is formed between a nitride film and a semiconductor substrate in order to lessen the stress caused by the different characteristic of heat expansion of the substrate and the nitride film which is formed on the active area and used as a hard mask. Then, a field area on which no nitride film is formed is oxidized to form a field oxide film used as an isolation area. The field oxide film grows under the edge of a nitride film pattern horizontally as well as vertically since oxidant diffuses along with the pad oxide film.

Such a phenomenon is so-called a Bird's Beak in that the field oxide film encroaches on the active area. The length of the bird's beak is half a thickness of the field oxide film. Hence, the length of bird's beak is to be minimized in order not to decrease the active area.

Although a method of decreasing the thickness of the field oxide film to reduce the length of bird's beak has been introduced, a speed of delivering a signal is lowered due to the increase of parasitic capacitance between a conductive line and semiconductor substrate over 16M DRAM. Moreover, the characteristic of isolation between devices deteriorates due to the reduced threshold voltages Vt of parasitic transistors formed in the isolation area between devices by a conductive line used as a gate of each device.

Accordingly, methods of improving the isolation characteristics have also been developed to reduce the length of bird's beak such as PBLOCOS(Poly Si Buffeted LOCOS) inserting a polysilicon layer between a semiconductor substrate and a nitride film and reducing the thickness of a pad oxide film for buffering stress, SILO(Sealed Interface LOCOS) protecting a sidewall spacer of a pad oxide film and Recessed Oxide LOCOS forming a field oxide film in a semiconductor substrate.

Unfortunately, such methods as mentioned above are no longer appropriate for a method of isolating devices of next generation having integrity over 256M DRAM due to a precise design rule and the planarity of a surface of the isolation area.

Accordingly, a method of box typed trench isolation having buried oxide has been developed to overcome the problems having been caused by the conventional arts. Trench Isolation has a structure of a buried oxide film formed by CVD(Chemical Vapor Deposition) after a trench has been formed in a semiconductor substrate. Thus, the loss of an active layer is prevented from bird's beak. And an even surface is attained by means of filling the trench with oxide and etching back the oxide.

FIG. 1A to FIG. 1D show cross-sectional views of isolating semiconductor devices according to a conventional art.

Referring to FIG. 1A, a first oxide film 13 is formed on a semiconductor substrate 11 by heat oxidation. Then, a nitride film 15 is formed on the first oxide film 13 by CVD. An isolation and active area are defined by means of removing certain parts of the first oxide film 13 and the nitride film 15 selectively by photolithography to expose a surface of the semiconductor substrate 11. A first and second trench 17 and 18 having different sizes are formed by dry etching the exposed isolation area of the semiconductor substrate 11 to have both a certain inclination angle and a certain depth in use of the remaining nitride film 15 as a hard mask.

Referring to FIG. 1B, a second oxide film 19 is formed by thermally oxidizing the inner surfaces of the first and second trenches 17 and 18, wherein the second oxide film 19 compensates for the damages caused by the formation of the trenches such as lattice defects formed inner surfaces of the trenches 17 and 18 and is not formed on the surface of the nitride film 15.

A filling oxide 21 is formed on the nitride film 15 by CVD to fill up the trenches 17 and 18 with silicon oxide, wherein the filling oxide is well deposited in the first trench 17 having a low aspect ratio due to its wide size. On the contrary, a void 22 is formed inside the filling oxide 21 in the second trench 18 having a high aspect ratio due to its small size, wherein the void 22 is caused by the deposition characteristics of the filling oxide 21 and lies on the level of the surface of the silicon substrate 11.

Referring to FIG. 1C, a field oxide film 23 is formed by means of removing a portion of the filling oxide 21 having been formed only on the nitride film 15 to remain inside the trenches 17 and 18 by CMP(Chemical Mechanical Polishing), whereby the void 22 in the filling oxide 21 is disclosed.

Referring to FIG. 1D, the nitride film 15 and the first oxide film 13 are removed in turn by wet etch, wherein the surface of the first oxide film 13 remaining in the trenches 17 and 18 is also removed to be planar with the surface of the semiconductor substrate 11.

However in the above-mentioned conventional method of isolating semiconductor devices, the middle part of the field oxide film filling up the first trench having a high aspect ratio caves in due to the void, and then its size increases on removing the first oxide film, etc.

On forming a gate, polysilicon remains on the middle part of the field oxide to short. Parasitic capacitance between the semiconductor substrate and the conductive line such as a wordline and a bitline and the like also increases due to the decrease of the thickness of the field oxide film by the middle part.

Moreover, the characteristics of isolation is lowered and the Latch-Up appears when the void is prevented by means of forming a shallow trench or a trench having a small angle of inclination in order to fill up the trench with ease.

SUMMARY OF THE INVENTION

Accordingly, the present invention is directed to a method of isolating semiconductor devices that substantially obviates one or more of the problems due to limitations and disadvantages of the related art.

The object of the present invention is to provide a method of isolating semiconductor devices which prevents the cave-in on the surface of the field oxide film formed in the trench from the void.

Another object of the present invention is to provide a method of isolating semiconductor devices which prevents the increase of parasitic capacitance between the semiconductor substrate and the conductive line.

A further object of the present invention is to provide a method of isolating semiconductor devices which prevents Latch-Up and the decrease of characteristic of isolation.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes the steps of forming a mask on a semiconductor substrate wherein the mask discloses field areas, forming a first and second trench in the field areas of the semiconductor substrate wherein the first trench has a larger size and a lower aspect ratio than those of the second trench and wherein the second trench has a smaller size and a higher aspect ratio than those of the first trench, depositing filling oxide on the mask and in the first and second trench by a method including characteristic of sputtering wherein the first and second trench are filled up with the filling oxide and a void is formed on a lower part of the second trench, and forming a field oxide film by means of etching back the filling oxide to remain inside the first and second trench.

In another aspect of the present invention, the invention includes the steps of forming a mask on a semiconductor substrate wherein the mask discloses field areas, forming a first and second trench in the field areas of the semiconductor substrate wherein the first trench has a larger size and a lower aspect ratio than those of the second trench and wherein the second trench has a smaller size and a higher aspect ratio than those of the first trench, depositing filling oxide on the mask and in the first and second trench by a method including characteristic of sputtering wherein a protruding part is formed at an entrance of said second trench, depositing said filling oxide continuatively to fill up insides of the first and second trench without changing conditions of deposition wherein a size of the protruding part increases to form a void at the lower part of said second trench, and forming a field oxide film by means of etching back the filling oxide to remain inside the first and second trench.

In a further aspect of the present invention, the invention includes the steps of forming a mask on a semiconductor substrate wherein the mask disclosing field areas having difference in size, forming a first and second trench in the field areas of the semiconductor substrate by means of etching firstly upper parts of the field areas to have 45~80° inclination and secondly lower parts of the field areas to be perpendicular to a surface of the semiconductor substrate wherein the first trench having a lower aspect ratio than that of the second trench and wherein the second trench has a higher aspect ratio than that of the first trench, depositing filling oxide on the mask and in the first and second trench by a method including characteristic of sputtering wherein the first and second trench are filled up with the filling oxide and a void is formed on a lower part of the second trench, and forming a field oxide film by means of etching back the filling oxide to remain inside the first and second trench.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention.

DETAILED DESCRIPTION OF THE PREFERRED EMBODIMENT

Reference will now be made in detail to the preferred embodiments of the present invention, examples of which are illustrated in the accompanying drawings.

FIG. 2A to FIG. 2E show cross-sectional views of isolating semiconductor devices according to an embodiment of the present invention.

Figure 1A:
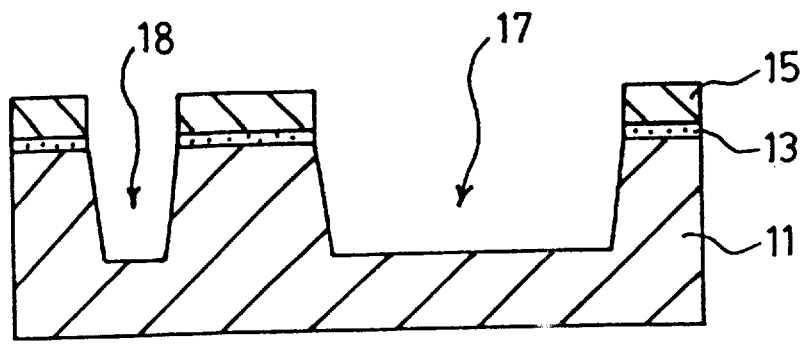
FIG. 1A to FIG. 1D show cross-sectional views of isolating semiconductor devices according to a conventional art.
Figure 1B:
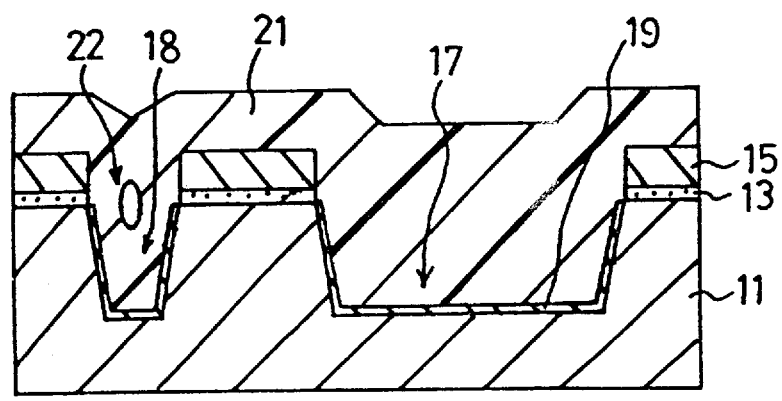
Figure 1C:
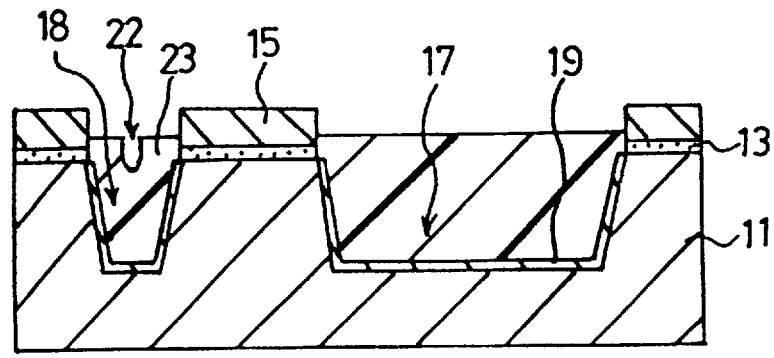
Figure 1D:
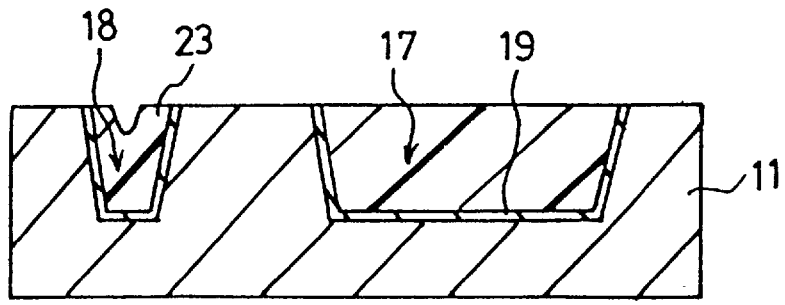
Figure 2A:
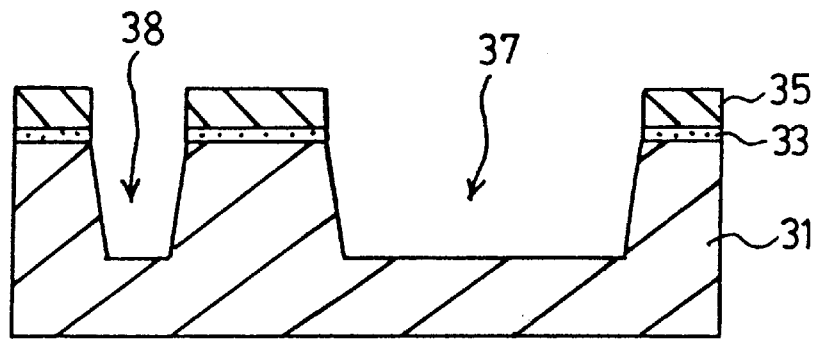
FIG. 2A to FIG. 2E show cross-sectional views of isolating semiconductor devices according to an embodiment of the present invention.

Referring to FIG. 2A, a first oxide film 33 is formed on a semiconductor substrate 31 to the thickness of 100~200 Å by thermal oxidation. Then, a nitride film 35 is formed on the first oxide film 33 to the thickness of 1000~2000 Å by CVD.

An isolation and active area are defined by removing certain parts of the first oxide film 33 and the nitride film 35 selectively by photolithography to expose a surface of the semiconductor substrate 31. A first and second trench 37 and 38 having different sizes are formed to have both a certain angle such as 80~90 their inclination and a certain depth of 2000~4000 Å in use of the remaining nitride film 15 as a hard mask, by dry etching the exposed isolation area of the semiconductor substrate 31 with etching gas including chlorine.

Figure 2B:
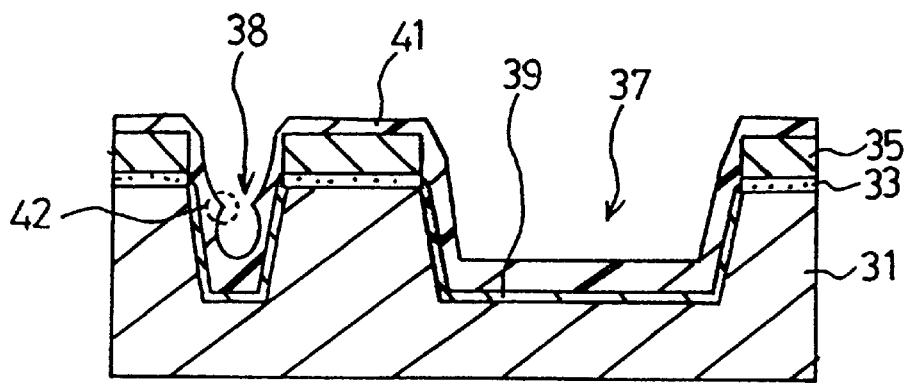

Referring to FIG. 2B, a second oxide film 39 is formed to the thickness of 100~400 Å by thermally oxidizing the inner surfaces of the first and second trenches 37 and 38, wherein the second oxide film 39 compensates for the damages caused by the formation of the trenches such as lattice defects formed inner surfaces of the trenches 37 and 38 and is not formed on the surface of the nitride film 35.

A filling oxide 41 is formed on the second oxide film 39 having been formed on the surfaces of the first and second trench 37 and 38 and the nitride film 35 by depositing silicon oxide, wherein the filling oxide 41 is deposited by HDPCVD (High Density Plasma Chemical Vapor Deposition). The filling oxide 41 is deposited thereof by applying a bias power of 2000~3500 W under the atmosphere of an inert gas such as Ar, Ne or He and the temperature of 500~600° C. HDPC the characteristic of CVD and also includes that of sputtering. Thus, particles of silicon oxide incident on the second trench 38 having a higher aspect ratio than the first 37 are deposited and reflected. The reflected particles of silicon oxide are deposited on the entrance of the second trench 38 to form a protruding part 42. Once the density of the atmosphere gas or the bias power is increased, the protruding part may be formed on the lower part of the second trench 38. The filling oxide maybe formed by other methods such as Low Pressure CVD, Atmospheric Pressure CVD or Sub Atmosphere CVD.

Figure 2C:
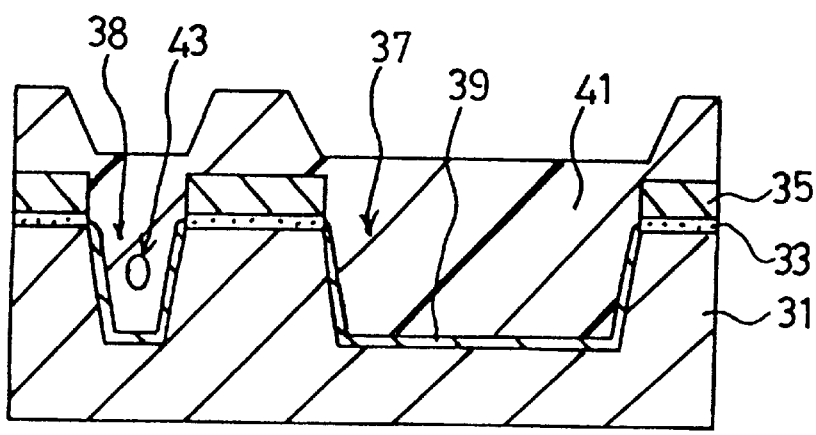

Referring to FIG. 2C, with the same conditions in depositing the filling oxide 41 in FIG. 2B, the deposition process proceeds to fill up the first and second trench 37 and 38. Then, the protruding part 42 grows to touch each other and a void 43 is generated from the increase of the size of the protruding part 42 in accordance with the increase of the thickness of the filling oxide 41. As the protruding part is formed on the lower part of the second trench 38, so does the void 43 thereof.

Figure 2D:
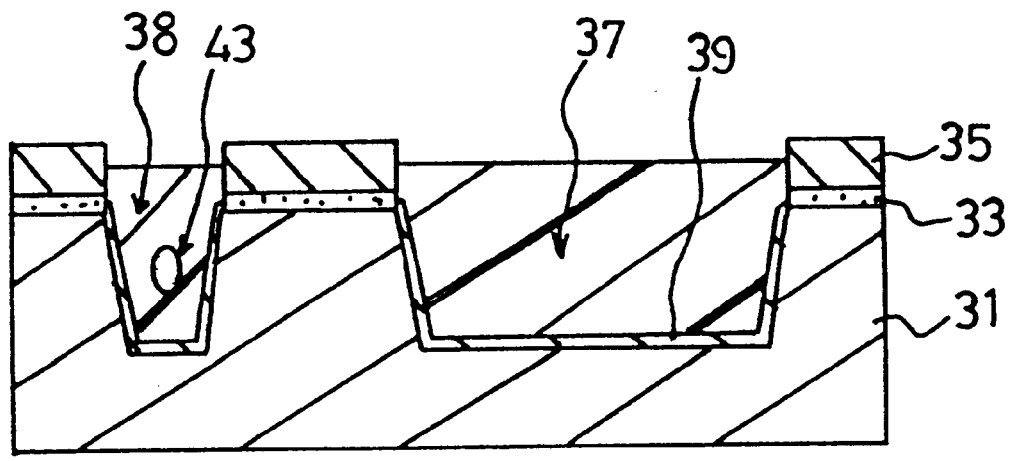

Referring to FIG. 2D, the filling oxide 41 is etched back by CMP to disclose the nitride film 35, remaining just inside the first and second trench 37 and 38. The filling oxide 41 remaining in the trench 37 and 38 becomes a field oxide film 45 with which the void 43 is covered with owing to its 43 location. The capacitance of the field oxide 45 increases due to the decrease of the thickness of field oxide film 45 by the void 43 in the second trench 38. The dielectric constant of the air in the void 43 is smaller than that of silicon oxide of the field oxide film 45. Thus, the sum of the capacitances of the field oxide film 45 and the void 43 is reduced to decrease the parasitic capacitances between the semiconductor substrate 31 and a conductive line not shown in FIG. 2D such as a wordline and bitline.

Figure 2E:
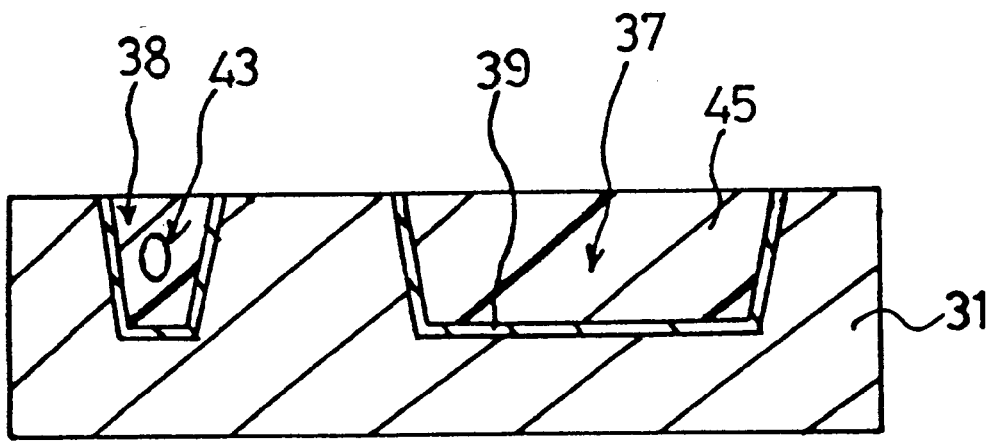

Referring to FIG. 2E, the nitride film 35 and the first oxide film 33 are removed in turn by wet, wherein the surface of the first oxide film 33 remaining in the trenches 37 and 38 is also removed to be planar with the surface of the semiconductor substrate 31.

Electrical shorts between neighboring gates are prevented since no conductive material remains on forming a gate of conductive material such as polysilicon and the like owing to no cave-in on the surface of the field oxide film 45.

Figure 3A:
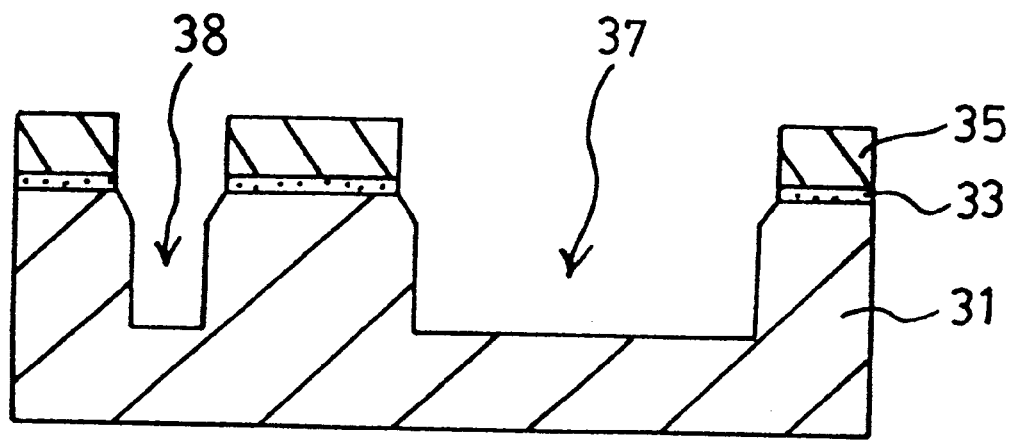
FIG. 3A and FIG. 3B show cross-sectional views of isolating semiconductor devices according to another embodiment of the present invention.
Figure 3B:
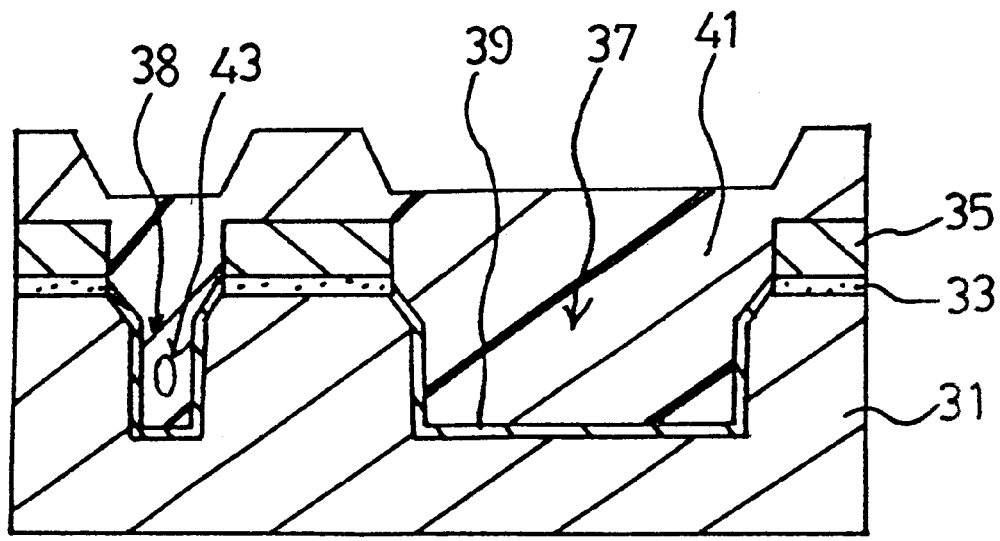

FIG. 3A and FIG. 3B show cross-sectional views of isolating semiconductor devices according to another embodiment of the present invention.

Referring to FIG. 3A, a first oxide film 33 is formed on a semiconductor substrate 31. Then, a nitride film 35 is formed on the first oxide film 33 by means of depositing silicon nitride. An isolation and active area are defined by means of removing certain parts of the first oxide film 33 and the nitride film 35 selectively by photolithography to disclose a surface of the semiconductor substrate 31.

A first and second trench 37 and 38, of which upper parts have a certain angle such as 45~80° of their inclination and of which lower parts are perpendicular to the surface of the substrate 31, are formed to the thickness of 2000~4000 Å by two-stepped etch.

The first etching step is carried out to form the depth of 200~500 Å with enchants such as $SF_6$, $Cl_2$ or $Cl_2$+HBr and the bias power of 50–100 W.

The etched silicon particles of the semiconductor substrate 31 are reacted with etching gas to form polymers which are deposited on the bottom surface of the etched semiconductor substrate 31, giving a slope to the trenches 37 and 38.

The second etching step is carried out to form the total depth of 2000~4000 Å of the trenches 37 and 38 with enchants such as $Cl_2$+HBr and the bias power of 300–500 W, etching the substrate anisotropically with the increased bias power.

Referring to FIG. 3B, a second oxide film 39 is formed to the thickness of 100–400 Å on the inner surfaces of the first and second trench 37 and 38 by thermal oxidation. The second oxide film 39 compensates for the lattice defects and the like formed by dry etch inside the first and second trench 37 and 38. Negative slopes in the semiconductor substrate 31 are prevented since the upper parts of the first and second trench 37 and 38 have 45~80° of inclination in spite of the fast oxidation for the second oxidation film. The round edges coming from the inclination at the upper parts of the trenches 37 and 38 lessens the field strength therein.

Filling oxide 41 is formed by HDPCVD on the nitride film 35 and in the trenches 37 and 38 to be filled up. A void 43 is formed in the lower part of the first trench 38 by means of depositing the filling oxide 41 under the atmosphere of inert gas such as Ar, Ne or He and the like, the temperature of 500~600° C., particles of silicon oxide incident on the second trench 38 having a higher aspect ratio than the first 37 are deposited and reflected. The reflected particles of silicon oxide are deposited on the entrance of the second trench 38 to form a protruding part not shown in FIG. 3B.

The protruding part grows to form the void 43 in the continuative deposition. Once the density of the atmosphere gas or the bias power is increased on forming the filling oxide 41, the void 43 may be formed on the lower part of the second trench 38. A field oxide film 45 is formed by means of etching back the filling oxide 41 to have portions of the filling oxide 41 only remain in the first and second trench 37 and 38 and in turn removing the nitride film 35 and the first oxide film 33.

It will now be apparent to those skilled in the art that various modification and variations can be made in a method of isolating semiconductor devices of the present invention without departing from the spirit or scope of the inventions. Thus, it is intended that the present invention cover the modifications and variations of this invention provided they come within the scope of the appended claims and their equivalents.

What is claimed is:

1. A method of isolating semiconductor devices, comprising the steps of:

forming a mask layer on a semiconductor substrate, said mask layer defining field areas and active areas;

forming a first trench and a second trench in said field areas of said semiconductor substrate, wherein a width of said first trench is greater than that of said second trench; and forming an insulating layer in said first and said second trench, wherein said insulating layer formed in said second trench has a void beneath a surface of said semiconductor substrate.

2. The method of isolating semiconductor devices according to claim 1, wherein said first and second trench are formed to have 80~90° inclination of their sides in use of an enchant including chlorine.

3. The method of isolating semiconductor devices according to claim 2, wherein said first and second trench are formed to have the depth of 2000~4000 Å.

4. A method of isolating semiconductor devices according to claim 1, said step of forming said first and second trenches including the steps of:

etching upper parts of said field areas to form sides having a 45~80° inclination; and etching lower parts of said field areas to form sides perpendicular to said surface of said semiconductor substrate.

5. The method of isolating semiconductor devices according to claim 4, wherein said step of etching said upper parts is carried out to the depth of 200~500 Å with an enchant such as $SF_6$, $Cl_2$ or $Cl_2$+HBr under bias power of 50~100 W.

6. The method of isolating semiconductor devices according to claim 4, wherein said step of etching said upper parts is carried out with an etchant of $Cl_2$+HBr under bias power of 300~500 W.

7. The method of isolating semiconductor devices according to claim 1, said step of forming said first and second trenches further comprising the step of oxidizing thermally inner surfaces of said first and second trench to form a thermal oxide film.

8. The method of isolating semiconductor devices according to claim 1, said step of forming said insulating layer further comprising the steps of:

depositing insulating material on said mask layer and inner surfaces of said first and said second trenches to form a protruding part at an entrance of said second trench;

depositing successively said insulating material to fill up said first and said second trenches; and etching back said insulating material to remain only inside said first and said second trenches.

9. The method of isolating semiconductor devices according to claim 8, wherein said insulating material is deposited by low pressure CVD, atmospheric pressure CVD or sub-atmospheric CVD.

10. The method of isolating semiconductor devices according to claim 1, wherein said insulating material is deposited by high density plasma CVD.

11. The method of isolating semiconductor devices according to claim 10, wherein said insulating material is deposited by increasing a density of inactive gases or bias power to form said void at the lower part of said second trench.

12. The method of isolating semiconductor devices according to claim 11, wherein said insulating material is deposited under the condition of inactive gas such as Ar, Ne or He, between 500–600° C. and by applying said bias power of 2000–3500 W.

13. A method of isolating semiconductor devices, comprising the steps of:

forming a mask layer defining field areas and active areas on a semiconductor substrate;

forming a first trench and a second trench in said field areas of said semiconductor substrate wherein a width of said first trench is greater than that of said second trench; and forming an insulating layer in said first and second trenches wherein a protruding part is formed at an entrance of said second trench, and wherein said insulating layer in said second trench has a void beneath a surface of said semiconductor substrate by virtue of said protruding part.

14. The method of isolating semiconductor devices according to claim 13, wherein said insulating layer is formed by depositing silicon oxide by high density plasma CVD, low pressure CVD, atmospheric pressure CVD or sub-atmospheric CVD.

15. A method of isolating semiconductor devices, comprising the steps of:

forming a mask layer on a semiconductor substrate, said mask layer defining field areas and active areas;

forming a first trench and a second trench in said field areas of said semiconductor substrate, wherein upper sides of said first and second trenches are inclined and lower sides of said first and second trenches are vertical, and wherein a width of said first trench is greater than that of said second trench; and forming an insulating layer in said first and second trenches, wherein said insulating layer formed in said second trench has a void beneath a surface of said semiconductor substrate.

16. The method of isolating semiconductor devices according to claim 15, wherein said step of forming said first and second trenches includes a step of etching carried out to the depth of 200~500 Å with an etchant such as $SF_6$, $Cl_2$ or $Cl_2$+HBr under bias power of 50~100 W.

17. The method of isolating semiconductor devices according to claim 15, wherein said step of forming said first and second trenches includes a step of anisotropically etching with an etchant of $Cl_2$+HBr under bias power of 300–500 W.

18. The method of isolating semiconductor devices according to claim 15, said step of forming said insulating layer further comprising the steps of:

depositing insulating material on said mask layer and inner surfaces of said first and second trenches to form a protruding part at an entrance of said second trench;

depositing successively said insulating material to fill up said first and second trenches; and etching back said insulating material to remain only inside said first and second trenches.

19. The method of isolating semiconductor devices according to claim 18, wherein said insulating layer is formed by depositing silicon oxide by high density plasma CVD, low pressure CVD, atmospheric pressure CVD or sub-atmospheric CVD.

* * * * *